United States Patent [19]

Dybwad

[11] 4,008,117
[45] Feb. 15, 1977

[54] APPARATUS FOR BONDING AND PLATING WITH EXPLODING FOIL

[75] Inventor: Gay Leon Dybwad, Emmaus, Pa.

[73] Assignee: Bell Telephone Laboratories, Incorporated, Murray Hill, N.J.

[22] Filed: Feb. 21, 1975

[21] Appl. No.: 551,774

Related U.S. Application Data

[62] Division of Ser. No. 362,191, May 21, 1973, abandoned.

[52] U.S. Cl. .................................. 156/380; 65/40; 65/59 B; 118/49.5; 118/620; 156/537; 219/76; 219/113; 219/148; 228/2.5; 427/50

[51] Int. Cl.² .................. B23K 11/26; C03C 27/08; C23C 13/08

[58] Field of Search .......... 156/272, 275, 380, 598, 156/99, 537; 228/121, 242, 174, 107, 2.5; 219/112, 113, 117 R, 118, 148, 76, 68; 427/12, 49, 50, 250; 118/620, 49.1, 49.5; 29/200 E, 421 E; 65/40, 59 B; 428/432

[56] References Cited

UNITED STATES PATENTS

| 2,662,045 | 12/1953 | Braggott | 156/275 |
|---|---|---|---|
| 3,214,564 | 10/1965 | Katzer et al. | 219/117 R |
| 3,428,773 | 2/1969 | Basiulis | 219/68 |
| 3,592,993 | 7/1971 | Bennett | 219/118 X |
| 3,708,865 | 1/1973 | Grin et al. | 228/107 X |
| 3,739,614 | 6/1973 | Cranston | 228/107 X |
| 3,846,204 | 11/1974 | Eisler | 156/275 |

OTHER PUBLICATIONS

Schiff, D. "Bonding Experiments with Exploding Foils", in Exploding Wires, vol. 1, Plenum Press, N.Y. (1959) pp. 283–287.
Keller, D. V. et al., "Exploding Foils–The Production of Plane Shockwaves and the Acceleration of Thin Plates" in Exploding Wires vol. 2, Plenum Press, New York (1962) pp. 263–277.
Rouse, C. A. [ed.], Progress in High Temperature Physics and Chemistry, vol. 2, Pergamon Press, N.Y. (1968) pp. 35–38.
Woffinden, G. J. "Exploding Metal Films" in *Exploding Wires*, vol. 3, Plenum Press, New York (1964) pp. 193, 198–199, 204–205.

*Primary Examiner*—Charles E. Van Horn
*Assistant Examiner*—M. G. Wityshyn
*Attorney, Agent, or Firm*—Barry H. Freedman

[57] ABSTRACT

Bonds are made between two work pieces by using foils exploded by electrical energy typically stored in a large capacitor. To increase the uniformity of the bond area, a foil having at least one slit cut in the direction of current flow is used. The foil strips separated by the slit are attracted together by the pinch effect when current is applied, tending to eliminate loss of foil through a jetting action during explosion. Platings are made by pressing the foil between the work piece and a plastic layer to which the foil does not adhere. In both bonding and plating, the capacitor is charged with energy sufficient to bring the foil just to its boiling point. This "tuning" is more efficient and minimizes heat and blast effects that might otherwise damage a small work piece.

13 Claims, 6 Drawing Figures

APPARATUS FOR BONDING AND PLATING WITH EXPLODING FOIL

This is a division of application Ser. No. 362,191, filed May 21, 1973, now abandoned.

BACKGROUND OF THE INVENTION

1. Field of the Invention

This invention relates generally to apparatus for and the method of bonding and plating work pieces by the use of foil exploded by the application of high intensity electrical current flow, and, more particularly, to improvements therein for producing bonds of high uniformity and strength.

2. Description of the Prior Art

While exploding wire phenomena have been known for a long time, they have been studied intensively only for the past 20 years or so. The usual apparatus used consists of an energy storage device, such as a large capacitor, coupled electrically, through a switch, to a thin metal foil or a wire of small cross section. When the switch is closed, the stored energy is dumped into the wire or foil, causing the current therethrough to rapidly build up, resulting in melting and then vaporization of the wire or foil. The fast change of state of the wire or foil usually causes a shock wave to be formed in the ambient atmosphere surrounding the wire or foil, which is heard as a "pop" or "crack." Thus, the term "exploding wire" aptly describes this procedure.

Various uses for exploding wires or films have been developed. The common fuse is perhaps the best known application. Vaporized metal in a wire explosion has been used to make thin platings inside cylinders, and thin exploding foils have been used to bond quartz rods together. In the latter application, the foil is sandwiched between the work pieces to be bonded and the foil connected to the energy storage circuit. During the explosion, the work pieces ideally trap the vaporized metal between them, and when the hot metal cools, a solid metal bond is formed between the work pieces.

Despite the attractive features of explosive foil bonding, which include rapid ($\sim$2–5 $\mu$sec) bond times and simple and inexpensive circuitry and materials, several problems are associated with the use of this method. First, and most importantly, is the formation of striations in the exploded film, which lead to uneven bond areas and an unnecessary waste of film material. These striations, sometimes called "streamers," appear as small sections of the exploded foil, each of which has a long dimension perpendicular to the length of the foil, which is also the direction of current flow. Striations have been observed in laboratory studies through the use of fast X-ray pictures of an exploding film, pictures of the final shapes of exploded films deposited on glass substrates and by analyzing shapes of slag formation when an explosion occurs in a container filled with sand. While the exact cause of striations is not clear, it is believed that their formation is focused in the area of "hot spots" in the foil, which result from uneven current distribution and thus nonuniform heating of the foil during an explosion.

Another problem associated with exploding foils used for bonding and plating is the damage done to the work piece by heat and blast effects. During the explosion temperatures and pressures in excess of 10,000° K and $10^{12}$ dynes/$cm^2$, respectively, can easily be reached, although for only very short periods of time. Obviously, it is desirable to reduce these pressures and temperatures as much as possible, in order to prevent unnecessary damage and also to reduce the energy consumed in an explosion. However, sufficient energy must of course be used to produce the desired bonding or plating action.

In view of the foregoing, it is the broad object of the present invention to provide improved apparatus for and methods of bonding and plating using an exploding foil. Additional specific objects of the invention are to minimize the formation of striations, thus increasing the uniformity of a bonded or plated area, and to maximize the efficiency of the explosion, thereby reducing undesirable heat and blast effects and energy consumption.

SUMMARY OF THE INVENTION

Each of the foregoing and additional objects are achieved in accordance with the principles of the instant invention by the use of a specially contoured foil for explosive bonding and plating and by "tuning" the circuitry used for generating the explosion so that sufficient energy is delivered to the foil to bring it just to its boiling point. More specifically, the contoured foil includes at least one slit cut in the direction of current flow, thereby forming at least two foil strips separated by the slit. For bonding, the foil is sandwiched between the work pieces to be joined, and stored energy is discharged therein, producing an explosion. For plating, the foil is sandwiched between the item to be plated and a layer, such as plastic, to which the foil does not adhere after the discharge. These strips are attracted together by the pinch effect when current is applied to the foil from an energy storage device, such as a large capacitor. As a result, foil ordinarily lost during an explosion by jetting action is minimized as is the formation of striations, yielding a more uniform bond or plated area. Tuning is accomplished by adjusting the foil dimensions to obtain an appropriate initial foil resistance and by regulating the initial energy stored to bring the foil just to its boiling point. In this way, efficient use is made of the stored energy, and heat and blast effects that could damage to work pieces are kept to a minimum level consistent with a desired explosion.

BRIEF DESCRIPTION OF THE DRAWING

Further features and advantages of the instant invention will be more fully appreciated by those skilled in the art from the following detailed description when read in light of the accompanying drawing in which.

DETAILED DESCRIPTION

Figure 1:
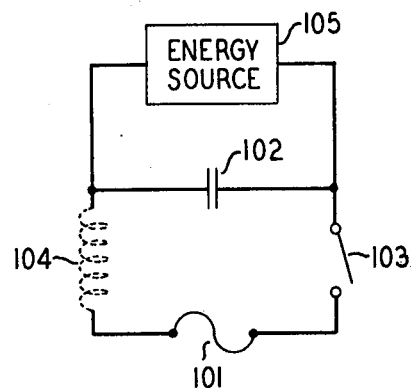
FIG. 1 is a schematic diagram of a prior art circuit for exploding foils to produce bonds or platings.

Referring first to FIG. 1, there is shown a schematic diagram of a prior art exploding foil circuit. Very simply, a strip of foil 101 is connected in series circuit relation with an energy storage device such as capacitor 102 and an electrical or mechanical switch 103. As will be discussed hereinafter, inductance is introduced in the circuit due to physical loop size and geometry, as well as the self inductance of capacitor 102, as is represented by inductor 104, shown dotted. An energy source 105 is arranged to supply energy to capacitor 102.

Foil 101 may, in accordance with the invention, be fabricated from any metal or metal alloy which can be rolled or otherwise formed into a thin sheet. Some of the materials which have been used successfully to produce bonds and platings are gold, aluminum, copper, lead and indium, although it is to be understood that certain other materials may instead be used.

Figure 2:
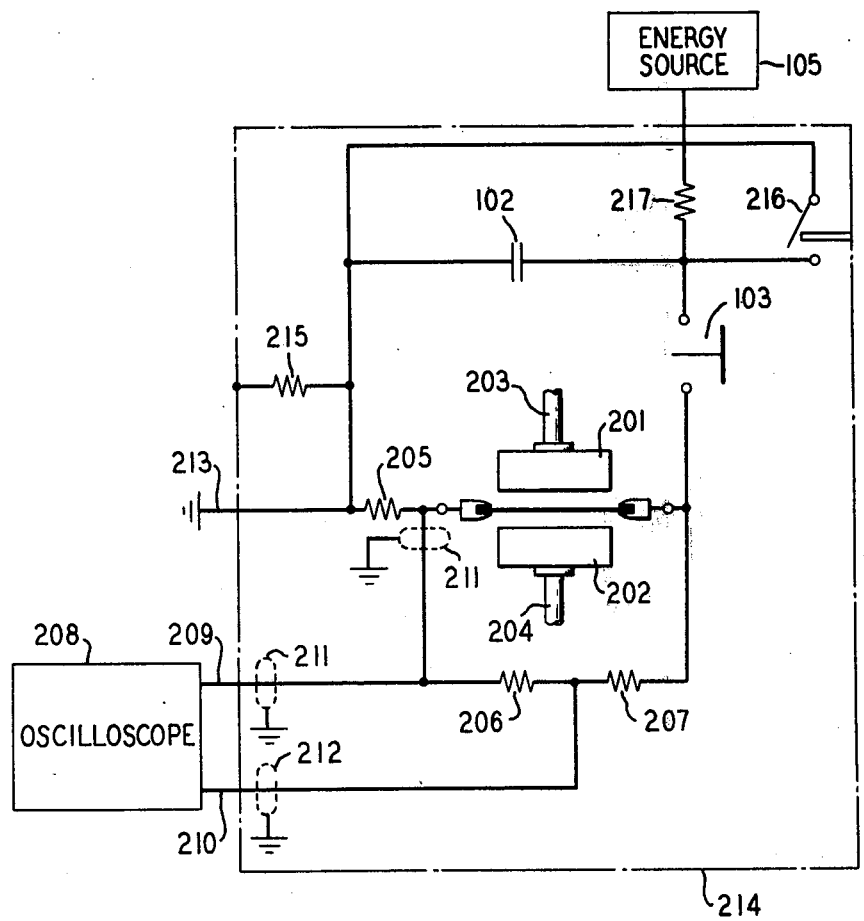
FIG. 2 is a more detailed diagram of a circuit in accordance with the instant invention for exploding foils, also showing provisions made for monitoring the explosion and for holding the work pieces in place.

A bond is produced, as shown in FIG. 2, by sandwiching foil 101 between a pair of work pieces 201, 202, held in position by a pair of clamps 203, 204 or any other suitable holding means. The clamps serve primarily to remove any air pockets between the work pieces due to wrinkles in the foil. Capacitor 102, after being charged by energy source 105, is discharged by closing switch 103. On explosion, the foil is melted and then boiled, and upon resolidification, the foil adheres to the inner surfaces of work pieces 201, 202 and forms a secure joint. A plating, which is nothing more than a one-sided bond, is produced in only a slightly different manner. One work piece, such as work piece 201, is fabricated from a material (plastic, for example) to which the exploded foil will not adhere. After the explosion, the plastic layer is peeled off, leaving a plating on the other work piece 202. One plastic material found suitable for use in plating is common household plastic foil, known commercially as Saran Wrap.

As shown in FIG. 2, provision may easily be made for monitoring and/or recording the electrical circuit parameters during an explosion. The circuit is equipped with a calibrated current viewing shunt 205 in series with the foil, and a voltage divider made from resistors 206 and 207 connected in parallel with foil 101. Current and voltage records of the explosion can thus be observed on a dual trace oscilloscope 208 set in the single sweep mode, by appropriately connecting the oscilloscope input points 209 and 210 to shunt 205 and voltage divider 206, 207, respectively. Because the foil explosion produces large transient voltages and currents, several steps must be taken to insure noise free oscillograms. Coaxial cable 211, 212, wound around ferrite rings (not shown) is used for leads to oscilloscope 208. A single earth ground point 213 is used, and a copper screen cage 214 is advantageously constructed around the circuit and connected to ground through a small damping resistor 215.

For safety purposes, a switch 216 is arranged to keep capacitor 102 shorted when not in use. With switch 216 open, capacitor 102 is charged by energy source 105 (a high voltage power supply, for example) through a high resistance load resistor 217.

Figure 3:
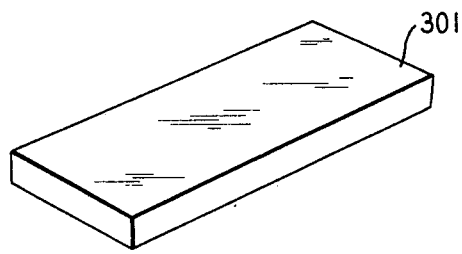
FIG. 3 is a view in perspective of a foil strip used in prior art explosive bonding.
Figure 4:
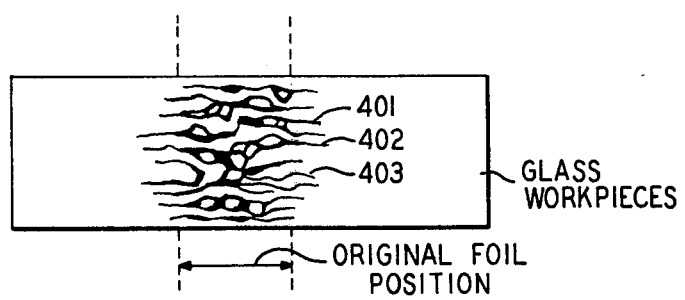
FIG. 4 is a top view of the foil of FIG. 3 after an explosion.

As will be discussed in more detail hereinafter, the physical size and characteristics of foil 101 determine, at least partially, the current and voltage response characteristics during an explosion, and thus the electrical efficiency of the bonding or plating process. The design of the foil is also directly related to the uniformity and strength of the bond or plating. Referring to FIG. 3, there is shown a prior art copper foil 301, which is simply a rectangular solid slab having approximate dimensions of 0.0005 inch thickness, 0.150 inch depth and 2.0 inch length. When exploded between a pair of glass work pieces using the circuit of FIG. 2, this foil typically produces a bond pattern as depicted in FIG. 4. As shown, the bond area is characterized by a number of streamers or striations 401, 402, 403, which are generally perpendicular to the length of the foil, which is also the direction of current flow. These striations extend out from the area originally occupied by foil 301 prior to explosion, so that in cases where the foil and work pieces are coextensive, it is apparent that an appreciable amount of foil material is wasted. This loss is significant especially in cases where expensive precious metal foils are used. In addition, visual inspection of the bond of FIG. 4 as well as laboratory tests of bond strength indicate that it is nonuniform and relatively weak.

Figure 5:
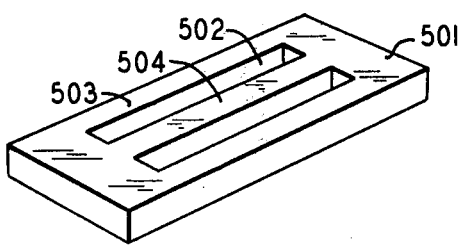
FIG. 5 is a view in perspective of a foil strip in accordance with the invention.

This difficulty is overcome, in accordance with the instant invention, by the use of a "contoured" foil, as shown in FIG. 5. The foil is basically a rectangular solid slab 501 including at least one slit 502 cut in the direction of current flow so as to form at least a pair of strips 503, 504 separated by slit 502. During an explosion, current flow is divided amoung strips 503 and 504. Current channeling, an effect caused by uneven current distribution, is appreciably diminished. Accordingly, more uniform heating of the foil is experienced, and hot spots which could cause streamer formation are reduced or eliminated. In addition, since strips 503 and 504 advantageously carry current in the same direction, electromagnetic forces on the strips are produced, which tend to pull the strips together.

While the foil of FIG. 5 is basically rectangular, it is to be clearly understood that other and sometime nonsymmetrical shapes may be used with equal success, in various circumstances. For example, if cylindrical glass tubes are to be bonded, a circular foil could be used. In this event, the slit would be cut in the direction of current flow, the direction being determined by the points of attachment of pairs which hold the foil and through which current flows. It is to be noted that slit 502 need not necessarily cut through the entire thickness of the foil. Rather, good results can also be obtained by one or more relatively parallel scratches or grooves in the foil which also tend to divide it into two or more strips or sections separated by the groove, each of which carries current in the same direction.

For a successful result, where full depth slits are used, it is required that strips 503 and 504 be pulled together by the pinch effect while the foil material is still in a molten condition. Thus, verification that the time to coalesce is smaller than the time to cool to a solid state is required. Time to coalesce is calculated by first considering the magnetic force of attraction F for parallel current conductors, which is $$F = \frac{-2\mu_o i^2(t)}{4\pi x(t)} l \tag{1}$$

where
 $\mu_o$ is the permeability of free space,
 $i(t)$ is current through the strips,
 $x(t)$ is the separation between strips, and
 $l$ is the length of the strips.

It has been shown that in the tuned case the current is approximately a half cycle sinusoid, so that $$i^2(t) = I^2 \sin^2 \omega t \text{ for } 0 < t < \frac{\pi}{\omega}$$
$$= 0 \text{ for } 0 > t > \frac{\pi}{\omega} \qquad (2)$$

where $\omega$ is the natural ringing frequency of the exploding foil circuit, determined experimentally to be 785 KHz, and $I = i_{max}$. Motion of the foil under the force $F$ commences when it becomes molten and can shear, which has been found to coincide with the current peak at time $t = \pi/2\omega$. Letting this be $t = 0$, $$m \frac{d^2x}{dt^2} = F = \frac{-2\mu_0 i^2 l}{4\pi x} \qquad (3)$$

where $m$ is the mass of the foil strips, 3.78 mgm in one experiment. The nonlinear differential equation to be solved for $x$ is then $$x \frac{d^2x}{dt^2} = -GI^2 \cos^2 \omega t \text{ for } x_0 \geq x \geq 0 \text{ and } 0 \leq t \leq \frac{\pi}{2\omega} \qquad (4)$$

where $x_o = x(t=0) = 0.0025$ meters in one experiment, and $$G = \frac{2\mu_0 l}{4\pi m} = 1.72 \times 10^{-3} \frac{m^2}{amp^2 \, sec^2}$$

for a length $l = 3.25$ cm.

Equation (4) may be solved by assuming a power series solution and determining the constant coefficients, $a_n$, by equating equal exponent terms in equation (4) after expanding $\cos^2 \omega t$ in a power series. Thus, $$x = \sum_{n=0}^{\infty} a_n t^n \text{ and} \qquad (5)$$

$$\cos^2 \omega t \approx 1 - \omega^2 t^2 + \frac{\omega^4 t^4}{3} - \frac{2\omega^6 t^6}{45} \qquad (6)$$

The coefficients are evaluated using the initial conditions $$x_0 = x(t=0) \text{ and } V_o = \frac{dx}{dt}\bigg|_{t=0} = 0.$$

The coefficients are:

$a_0 = x_o = 0.0025$ meters $a_1 = V_o = 0 = a_3 = a_5 \ldots$ $a_2 = \frac{-GI^2}{2x_o} = -2.79 \times 10^7 t^2$ $a_4 = \frac{GI^2}{12x_o} \left( \omega^2 - \frac{GI^2}{2x_o^2} \right) = 2.85 \times 10^{16} t^4$ so that
$$x(t) = 0.0025 - 2.79 \times 10^7 t^2 + 2.85 \times 10^{16} t^4 \qquad (7)$$

At $t = \pi/2\omega$, i.e., at the end of the current half sinusoid, $i = 0$ and $F = 0$, $\times x = 0.00244$ meters and the velocity $V_1$ is approximately 56 meters/second. Since the force is zero, the velocity will be constant if the molten foil is unimpeded. The time required to coalesce is thus $$t \approx \frac{x}{V} + \frac{\pi}{2\omega} = 46 \, \mu \text{ seconds.} \qquad (8)$$

This time is to be compared to the time it takes the molten foil to solidify, which is composed of times to cool by conduction, radiation, and free convection. Assuming a copper foil being used for bonding a pair of glass plates, cooling by conduction to the work pieces is the dominant heat loss process. Transient heat loss is governed by the equation $$\frac{T_{FINAL} - T_\infty}{T_{INITIAL} - T_\infty} = e^{-(Biot \, No.)F_n}, \text{ for Biot No.} < 10^{-1} \qquad (9)$$

where
$T_{FINAL}$ = melting temperature of copper = 1083° C
$T_{INITIAL}$ = boiling temperature of copper = 2595° C
$T_{28}$ = temperature = 25° C Biot No. = $\frac{\text{thermal resistance of glass}}{\text{thermal resistance of copper}}$ = $1.8 \times 10^{-5}$ $F_n$ = Fourier No. = $\frac{KtA^2}{\rho C V^2}$ $K$ = thermal conductivity of glass
$\rho$ = density of copper
$C$ = heat capacity of copper
$V$ = volume of copper foil
$A$ = surface area of copper foil
$t$ = time to reach $T_{FINAL}$ Using established reference values for the properties of glass and copper, time to cool by conduction, from equation (9), is approximately 18.5 msec. which is nearly three orders of magnitude longer than the time to coalesce.

The time to cool by radiation is determined by the Stefan-Boltzman equation. Radiant emission, $q_r$, is given by:

$$q_r = \sigma \epsilon A (T^4 - T_{Room}^4) = E \mid t \qquad (10)$$

where
$\sigma$ = Stefan-Boltzman constant
$\epsilon$ = emissivity of liquid copper $\approx 0.15$
$A$ = surface area of copper foil $T$ = average metal temperature = $\frac{T_{boil} + T_{melt}}{2}$ = 2112° K $T_{Room}$ = 300° K
$E$ = energy to be lost = $mC(T_{boil} - T_{melt})$ = 0.49 cal.
$t$ = time to cool in seconds.

Solving equation (10), $t$ = 181 msec, which is also many orders of magnitude greater than the time to coalesce, and 10 times longer than time to cool by conduction.

The time to cool by convection is very long compared to that of conduction and radiation, since contact of the molten foil to air is limited to only two sides, and, with a foil thickness of only 0.5 mil, the area of air contact is quite small. Thus, convective heat loss may reasonably be neglected.

The foregoing calculations show that a contoured foil in accordance with the invention will coalesce before the molten foil resolidifies. This is true even when friction forces which might act to slow the pinching action are considered, because, on the other hand, as contact between the molten strips is made, surface tension effects will aid the pinching action. In addition, the current half-cycle sinusoid in reality has a tail on it, so that the electromagnetic force actually continues past $t = \pi/2\omega$ for a few $\mu$ seconds and further slightly aids the pinching action.

Figure 6:
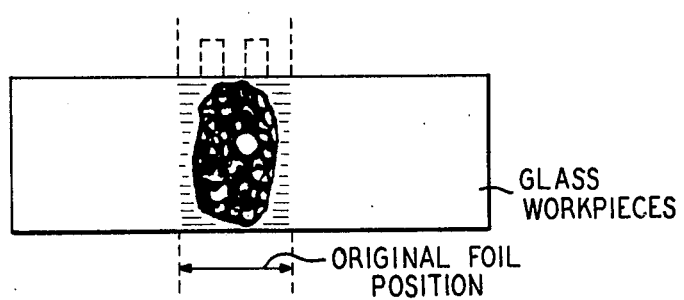
FIG. 6 is a top view of the foil of FIG. 5 after an explosion.

FIG. 6 shows a representative bond produced by use of a foil similar to the foil of FIG. 5. As can be seen, the bond area is more uniform than that of FIG. 4, and is thus proportionately stronger. Quantitatively, the relative bond areas were determined by taking enlarged photographs of the bonds in transmitted light, so that the voids showed clearly, and carefully removing the voids with a razor blade. The photographs were weighed before and after void removal and the ratio of void weight to original weight determined. In one experiment, results showed a bond area of 50 per cent for an ordinary foil and an area of 76 per cent for a foil as shown in FIG. 5, a relative improvement of 50 per cent.

For a full understanding of the process by which the circuit of FIG. 1 is tuned so that an efficient explosion is generated, analysis of the differential equation governing circuit current is useful. It is $$L\frac{d^2i}{dt^2} + R\frac{di}{dt} + \frac{1}{C_o}i = 0 \tag{11}$$

where $L$ is the total loop inductance including the inductance of capacitor 102, $C_o$ is the capacitance of capacitor 102, $i$ is current and $t$ is time. For initial conditions of no current at $t = o$ and a voltage $V_o$ on the capacitor, the solution is a damped sinusoid:

$$i = \frac{V_o \exp\left[-Rt/2L\right]}{L\sqrt{\frac{1}{LC_o} - \frac{R^2}{4L^2}}} \cdot \sin\left[t\sqrt{\frac{1}{LC_o} - \frac{R^2}{4L^2}}\right] \tag{12}$$

The value of $R$ in equation (12) determines the damping in the circuit. For optimum deposition of energy into the foil, it has been found that a slightly underdamped mode, in which $$R_{op} \approx 1.1\sqrt{L/C_o} \tag{13}$$

is desirable. To calculate $R_{op}$, $L$ must first be determined. This is done by solving equation (12) for the natural ringing frequency $f_o$, $$f_o = \frac{1}{2\pi}\sqrt{\frac{1}{LC_o} - \frac{R^2}{4L^2}} \tag{14}$$

which reduces to $$f_o \approx \frac{1}{2\pi}\sqrt{1/LC_o} \tag{15}$$

if the foil is replaced by a shorting bar of very low (i.e., less than $\approx 0.1\Omega$) resistance. With the shorting bar in place, the ringing frequency may be measured using conventional techniques, and equation (15) solved for $L$.

With $R_{op}$ determined, the geometry of the foil is governed by $$R_{op} = \frac{(\text{metal resistivity})(\text{length})}{\text{cross sectional area}} \tag{16}$$

Since the surface area of the foil is often fixed by the size of the work pieces to be bonded or plated, the thickness of the foil may thus be varied to satisfy equation (16). Alternatively, for a desired foil geometry, the value of $C_o$ may be adjusted so that equations (13) and (16) are satisfied.

It is to be noted that the foregoing analysis is strictly correct only for constant foil resistance. During explosion, however, R changes drastically from a low of $R_{op}$ to infinity after vaporization, so that somewhat modified electrical waveforms are actually experienced. Nonetheless, foil dimensions which yield an $R_{op}$ appropriate to the tuned condition (equation 13) is still found to be one that explodes the foil efficiently, without causing arcing or restrike in air after vaporization, and that reduces the shock forces on small or delicate work pieces. This is probably due to providing only enough energy to just boil the metal foil instead of completely vaporizing it.

If desired, the fact that energy transfer will be efficient may be verified by determining the circuit resistance $R_{CIRCUIT}$ (exclusive of $R_{op}$) from the decay rate of the current waveform in the shorted case, in which $$R_{CIRCUIT} = -2L\frac{\ln i}{t}. \tag{17}$$

A low value of $R_{CIRCUIT}$ in comparison to $R_{op}$ indicates that energy is efficiently dumped into the foil, and not dissipated in connecting leads and capacitor 102.

The equation which governs the amount of energy $E_o$ delivered to the foil, and thus is used to regulate the degree to which the foil is melted or vaporized, is $$E_o = \frac{1}{2} C_o V_o^2 \tag{18}$$

where $V_o$ is the initial voltage on capacitor 102. Experimental results have indicated that explosions which gave the best bonds (or platings) were ones in which the foil was brought just to its boiling point, and that full vaporization is not required. By thus limiting the amount of energy supplied to the foil, the danger of work piece damage by heat and blast effects is reduced, and energy is not wasted.

The thermodynamic equation used to determine the energy required to just bring the foil to its boiling temperature is $$E_{Boil}^{THERMO} = E_{MELT}^{THERMO} + M_o[C_p{}^{25°C} + (\text{CONST})T_{MELT}](T_{BOIL} - T_{MELT}) \tag{19}$$

in which $$E_{MELT}^{THERMO} = M_o(C_p{}^{25°C} \Delta T + L)$$

$C_p^{25°C}$ is the specific heat of the foil at 25° C $\Delta t$ is the temperature change from 25° C to the melting temperature L is the latent heat of transistion $M_o$ is the mass of the foil $T_{MELT}$ is the melting temperature of the foil $T_{BOIL}$ is the boiling temperature of the foil and CONST is a small constant representing the change of $C_p$ with temperature, which may be found in standard reference works such as the Chemical Rubber Company "Handbook of Physics and Chemistry," 49th edition.

Having determined $E_{BOIL}^{THERMO}$ from equation (19), the initial voltage $V_o$ on capacitor 102 is readily determined from equation (18).

Many modifications and adaptions of the instant invention will readily become apparent to those skilled in the art. Therefore, it is intended that the invention be limited only by the appended claims.

What is claimed is:

1. A system for bonding a pair of workpieces comprising, in combination,
   a metal foil,
   means for positioning said foil between said workpieces in an area to be bonded,
   energy storage means,
   means for supplying electrical energy to said energy storage means, and
   means for discharging said electrical energy stored in said energy storage means into said foil, whereby said foil is caused to explode by the current flowing therethrough, thereby bonding said workpieces,
   wherein said foil is characterized by at least one slit cut along a surface thereof and in a direction parallel to said current flow.

2. The invention, in accordance with claim 1 wherein said energy supplying means is arranged to charge said energy storage means with energy just sufficient to bring said foil to its boiling point during said explosion.

3. The invention in accordance with claim 1 wherein said foil is further characterized by a size and shape which produces an electrical resistance which causes said current flow to be a slightly underdamped sinusoid as a function of time.

4. A system, for bonding a pair of workpieces including
   a series circuit including a capacitor of capacitance C, a metal foil having a resistance $R_{op}$, and leads interconnecting said capacitor and said foil,
   said circuit further including an equivalent inductance L comprising the inductance of said capacitor and the distributed inductance of said interconnecting leads,
   means for positioning said foil between said workpieces,
   a power supply for charging said capacitor to a voltage $V_o$, and
   means including a switch in said circuit for discharging said capacitor into said foil, thereby causing said foil to explode by the application of a high intensity electrical current thereto,
   wherein said foil includes at least one slit cut along a surface thereof and in the direction of said current flow, said slit forming at least two strips in said foil each carrying current in the same direction during said explosion.

5. The invention defined in claim 4 wherein
   $R_{op} = 1.1\sqrt{L/C}.$

6. The invention defined in claim 4 wherein
   $E_{BOIL}^{THERMO}$ represents the energy required to bring said foil just to its boiling point, and said power supply is arranged so that $$V_o = \sqrt{\frac{2 E_{BOIL}^{THERMO}}{C}}.$$

7. A system for bonding a pair of workpieces, comprising:
   a metal foil positioned between said workpieces, and
   means for exploding said foil by the flow of electrical current therethrough, thereby bonding said workpieces together,
   wherein said foil is characterized by at least one slit cut along a surface thereof and in a direction parallel to said current flow.

8. The invention defined in claim 7 wherein said exploding means includes a circuit including a capacitor of capacitance C, a power supply for charging said capacitor, leads interconnecting said capacitor and said foil, and a switch in said circuit for discharging said capacitor into said foil.

9. The invention defined in claim 8 wherein
   said circuit further includes an equivalent inductance L comprising the inductance of said capacitor and the distributed inductance of said interconnecting leads,
   said foil has a resistance $R_{op}$, and
   $R_{op} = 1.1\sqrt{L/C}.$ 10. A system for coating a workpiece, comprising:
    a metal foil,
    means for positioning said foil adjacent to said workpiece, and
    means for exploding said foil by the flow of electrical current therethrough, thereby coating said workpiece with said metal,
    wherein said foil is characterized by at least one slit cut along a surface thereof and in a direction parallel to said current flow.

11. The invention defined in claim 10 wherein said positioning means includes a layer of material to which said foil, when exploded, will not adhere, and wherein said foil is positioned between said workpiece and said layer of material.

12. The invention defined in claim 11 wherein said exploding means includes a circuit including a capacitor of capacitance C, a power supply for charging said capacitor, leads interconnecting said capacitor and said foil, and a switch in said circuit for discharging said capacitor into said foil.

13. The invention defined in claim 12 wherein
    said circuit further includes an equivalent inductance L comprising the inductance of said capacitor and the distributed inductance of said interconnecting leads,
    said foil has a resistance $R_{op}$, and
    $R_{op} = 1.1\sqrt{L/C}.$

* * * * *